United States Patent
Ciotti et al.

(10) Patent No.: US 6,509,266 B1
(45) Date of Patent: Jan. 21, 2003

(54) HALOGEN ADDITION FOR IMPROVED ADHESION OF CVD COPPER TO BARRIER

(75) Inventors: Ralph J. Ciotti, Horseheads, NY (US); Scott Edward Beck, Kutztown, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/824,455

(22) Filed: Apr. 2, 2001

(51) Int. Cl.[7] ............................................. H01L 21/44
(52) U.S. Cl. .................. 438/687; 438/627; 438/628; 438/643; 438/644; 438/653; 438/654
(58) Field of Search ................. 438/687, 627–629, 438/633, 637–640, 643–644, 680, 672, 675

(56) References Cited

U.S. PATENT DOCUMENTS

| | | | |
|---|---|---|---|
| 3,356,527 A | 12/1967 | Moshier et al. | 117/107.2 |
| 5,085,731 A | 2/1992 | Norman et al. | 156/655 |
| 5,094,701 A | 3/1992 | Norman et al. | 148/23 |
| 5,098,516 A | 3/1992 | Norman et al. | 156/666 |
| 5,599,425 A | 2/1997 | Lagendijk et al. | 156/646.1 |
| 5,763,953 A * | 6/1998 | Iljima et al. | 257/751 |
| 5,909,637 A | 6/1999 | Charneski et al. | 438/687 |
| 5,913,144 A | 6/1999 | Nguyen et al. | 438/643 |
| 5,918,150 A | 6/1999 | Nguyen et al. | 438/687 |
| 5,948,467 A | 9/1999 | Nguyen et al. | 427/99 |
| 5,948,705 A * | 9/1999 | Jun | 438/672 |
| 5,953,634 A | 9/1999 | Kajita et al. | 438/687 |
| 5,968,847 A * | 10/1999 | Ye et al. | 216/67 |
| 6,015,749 A | 1/2000 | Liu et al. | 438/628 |
| 6,043,149 A * | 3/2000 | Jun | 438/658 |
| 6,150,269 A * | 11/2000 | Roy | 257/762 |
| 6,156,642 A * | 12/2000 | Wu et al. | 438/637 |
| 6,245,655 B1 * | 6/2001 | Moslehi | 438/612 |
| 6,245,665 B1 * | 6/2001 | Yokoyama | 438/623 |
| 6,261,953 B1 * | 7/2001 | Uozumi | 427/419.2 |
| 6,284,657 B1 * | 9/2001 | Chooi et al. | 438/637 |

FOREIGN PATENT DOCUMENTS

| | | |
|---|---|---|
| JP | 1098043 | 4/1998 |
| WO | 9963590 | 12/1999 |
| WO | 0003420 | 1/2000 |

OTHER PUBLICATIONS

Microelectronic Engineering 50 (2000) 547–553, Gandikota, et al.
Microelectronic Engineering 50 (2000) 501–508, Voss, et al.
Patent Application 09/638,586 filed Aug. 15, 2000 and Filing Receipt.
J. Electrochem Society(vol. 112, No. 11) pp. 1123–1126, Nov. 1965.
Electrochem and Solid–State Letters, 3(3) pp. 138–140 (2000).
Electrochem Society vol. 136, No. 11, Nov. 1989, Reisman, et al.
Journal of Electronic Materials vol. 19, No. 3, pp. 271–276.
Materials Science and Engineering B17 (1993) pp. 87–92, Norman, et al.

* cited by examiner

Primary Examiner—Tuan H. Nguyen
Assistant Examiner—Thanh Nguyen
(74) Attorney, Agent, or Firm—Geoffrey L. Chase

(57) ABSTRACT

A process is described for depositing a copper film on a substrate surface by chemical vapor deposition of a copper precursor. The process includes treating a diffusion barrier layer surface and/or a deposited film with an adhesion-promoting agent and annealing the copper film to the substrate. Suitable adhesion-promoting agents include, e.g., organic halides, such as methylene chloride, diatomic chlorine, diatomic bromine, diatomic iodine, HCl, HBr and HI. Processes of the invention provide copper-based films, wherein a texture of the copper-based films is predominantly (111). Such films provide substrates having enhanced adhesion between the diffusion barrier layer underlying the (111) film and the copper overlying the (111) film.

30 Claims, 1 Drawing Sheet

HALOGEN ADDITION FOR IMPROVED ADHESION OF CVD COPPER TO BARRIER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention relates to a chemical vapor deposition process for depositing copper films on barrier layer materials, and more specifically, to improving adhesion between copper and barrier layers.

CVD (Chemical Vapor Deposition) is a superior process for producing microscopic metal features on substrates. In this technique, a volatile metal-organic compound in the gas phase is contacted with areas of a circuit where growth of a metal film (e.g., an interconnect) is required.

Copper films have previously been prepared via CVD using various copper precursors. One of the best known and most frequently used CVD copper precursors is the solid compound copper$^{+2}$ bis(hexafluoroacetylacetonate) (i.e., copper$^{+2}$ bis(hfac)). This highly fluorinated organometallic precursor is significantly more volatile than its parent unfluorinated complex, copper$^{+2}$ bis(acetylacetonate), and its ease of vaporization has made it a popular choice for CVD processes. The use of this compound as a general precursor for CVD copper metallization was first described by Van Hemert et al. in J. Electrochem. Soc. (112), 1123 (1965) and by Moshier et al. in U.S. Pat. No. 3,356,527. More recently, Reisman et al. (J. Electrochemical Soc., Vol. 136, No. 11, November 1989) and Kaloyeros et al. (Journal of Electronic Materials, Vol. 19, No. 3, 271, 1990) in two independent studies evaluated the use of this compound as a copper precursor for electronics applications. In these studies, copper films were formed by contacting vapors of copper$^{+2}$ (hfac)$_2$, mixed with either an inert gas (argon) or hydrogen and contacting the mixture with a heated substrate surface. In the case of using hydrogen, the copper$^{+2}$ atom in the precursor complex is formally reduced to copper metal, while the hfac$^{-1}$ ligand becomes protonated to yield a neutral volatile compound. In the case of using an inert gas, the copper$^{+2}$ (hfac)$_2$ is simply pyrolyzed to give copper metal and fragments of the hfac ligand.

Selective deposition of pure copper films by CVD at low temperatures onto metallic substrates using Cu$^{+1}$ (hfac)L complexes (where L is alkene or alkyne) has been described previously by Norman et al. in U.S. Pat. Nos. 5,085,731, 5,094,701 and 5,098,516. Under certain conditions, blanket (non-selective) deposition can also be achieved using these precursors (Norman et al., E-MRS proc. B17 (1993) 87–92). A particularly effective CVD copper precursor is 1,1,1,5,5, 5-hexafluoro-2,4-pentanedionato-copper (I) trimethylvinylsilane (hereinafter Cu(hfac)(TMVS)), which is sold under the trademark CupraSelect by the Schumacher unit of Air Products and Chemicals, Inc., Carlsbad, Calif.

As shown by the following equations, precursors such as Cu(hfac)(TMVS) function by a surface catalyzed disproportionation reaction to give a volatile Cu$^{+2}$ complex, free olefin and copper metal (wherein (s) denotes interaction with a surface and (g) denotes the gas phase):

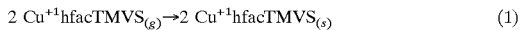

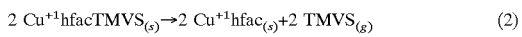

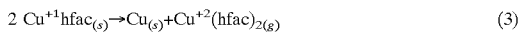

In Equation (1), the complex is adsorbed from the gas phase onto a metallic surface. In Equation (2), the coordinated olefin (TMVS in this example) dissociates from the complex as a free gas leaving behind Cu$^{+1}$hfac as an unstable compound. In Equation (3), the Cu$^{+1}$hfac disproportionates to yield copper metal and volatile Cu$^{+2}$(hfac)$_2$.

Despite the foregoing developments, the integrated circuit (IC) industry is presently experiencing difficulty forming adherent copper films on barrier layer materials such as Ta, TaN, TiN, etc., via chemical vapor deposition (CVD) with fluorinated precursors, including hfac-based precursors such as Cu(hfac)(TMVS). A variety of solutions to this problem have been proposed.

For example, Gandikota et al., 50 Microelectronic Engineering 547–53 (2000), purports to improve adhesion between a CVD copper thin film and barrier layers by: (a) depositing a copper flash layer on the barrier layer by physical vapor deposition (PVD) prior to chemical vapor deposition, or (b) annealing the CVD copper layer after deposition. See also Voss et al., 50 Microelectronics Engineering 501–08 (2000). Unfortunately, these methods are not acceptable to the IC industry because they add to the equipment requirements for the copper deposition step. In addition, annealing, particularly at elevated temperatures, can have deleterious effects on the overall product.

WO 00/03420 (Paranjpe et al.) discloses improving CVD copper adhesion to a diffusion barrier layer by: (a) annealing the seed layer deposited on the diffusion barrier layer surface, or (b) providing an inert seed layer (e.g., comprising a noble or passivated metal) on the diffusion barrier layer surface.

WO 99/63590 (Bhan et al.) discloses improving CVD copper adhesion to a diffusion barrier layer by: (a) providing a copper seed layer containing water on the diffusion barrier, and (b) annealing the seed layer with heat or ion bombardment.

U.S. Pat. No. 5,909,637 to Charneski et al. discloses a copper CVD method comprising exposing a surface of a diffusion barrier layer to a reactive gas species to purportedly replace high-energy molecular bonds on the surface with low-energy bonds between the reactive gas species and the surface. This is said to change the surface characteristics of the exposed copper-receiving surface to promote the formation of bonds between the copper-receiving surface and copper subsequently deposited by CVD, whereby copper adhesion to the diffusion barrier is improved. The low-energy bonds are said to promote the adhesion of copper to the diffusion barrier layer.

U.S. Pat. No. 5,913,144 to Nguyen et al. discloses a process for improving adhesion of CVD copper to barrier layers, comprising the steps of: exposing the copper-receiving surface to a reactive oxygen species; oxidizing a thin layer of the diffusion barrier material surface in response to the oxygen exposure; and stopping the exposure of the diffusion barrier material to the oxygen before the oxide layer exceeds approximately 30 angstroms, whereby the relatively thin oxide layer prepares the diffusion barrier material receiving surface for adhesion to copper.

U.S. Pat. No. 5,918,150 to Nguyen et al. discloses the use of an inert gas to remove contaminating byproducts of the disproportionation reaction which deposits copper on the diffusion barrier layer. Low energy ions of the inert gas are impinged upon the contaminated copper layer to physically displace contaminants thereon and provide a clean copper surface for additional copper CVD.

U.S. Pat. No. 5,948,467 to Nguyen et al. discloses a two-step deposition process, wherein the first step comprises copper CVD at a low deposition rate and the second step comprises copper CVD at a high deposition rate. The initial slow deposition rate is said to allow organic solvents within the precursor vapor to be carried out of the process chamber instead of being captured within the film at the interface between the diffusion barrier layer and overlying CVD copper. This is said to provide improved adhesion of CVD copper to the underlying diffusion barrier layer.

U.S. Pat. No. 5,953,634 to Kajita et al. discloses a two-step deposition process, wherein the first step comprises copper CVD in the presence of an oxidizing gas and the second step comprises copper CVD in the absence of the oxidizing gas.

JP-A-10-98043 (Nguyen et al.) discloses a method for oxidizing the surface of the to diffusion barrier layer to improve CVD copper adhesion thereto.

U.S. Pat. No. 6,015,749 to Liu et al. discloses improving CVD copper adhesion to diffusion barrier layers by implanting germanium ions in a copper seed layer deposited on the diffusion barrier layer surface.

In addition, the inventors filed on Aug. 15, 2000 U.S. patent application Ser. No. 09/638,586, which discloses improving CVD copper adhesion to diffusion barrier layers by treating a diffusion barrier layer surface and/or a deposited film with a donating molecule selected from the group consisting of a proton-donating molecule and a hydrogen-donating molecule (e.g., methylsilane).

Although the inventors are aware of references teaching the use of certain halogen-containing molecules in microelectronic processing, these references do not disclose the use of halogen-containing molecules to improve CVD copper adhesion to barrier layers. For example, U.S. Pat. No. 5,599,425 to Langendijk et al. discloses the use of certain organic chlorides in silicon processing, but does not teach that depositing copper on a barrier layer in the presence of a halogen-containing molecule can improve adhesion of the copper to the barrier layer.

Hwang et al., 3(3) Electrochemical and Solid-State Letters 138–40 (2000) discloses that certain iodine-containing molecules, including ethyl iodide, methyl iodide, tertiary-butyl iodide and molecular iodine, can minimize the roughness of surfaces deposited by copper MOCVD. The resulting films are said to be predominantly (111)-oriented, regardless of the deposition conditions, provided that iodine is adsorbed to the growing film surface. Hwang et al. does not disclose that halogen-containing molecules can improve the adhesion of the copper to a barrier layer.

Despite the foregoing developments, there remains a need in the art for alternative solutions to the CVD copper adhesion problem.

All references cited herein are incorporated herein by reference in their entireties.

BRIEF SUMMARY OF THE INVENTION

Accordingly, the invention provides an improved copper CVD process, wherein the improvement comprises treating at least one of the surface and the copper film with an adhesion-promoting agent comprising a halogen other than fluorine, and annealing the copper film to the surface. The inventive process provides copper-based films, wherein a texture of the copper-based films is predominantly (111). Such films provide substrates having enhanced adhesion between the diffusion barrier layer underlying the (111) film and the copper overlying the (111) film.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1A:
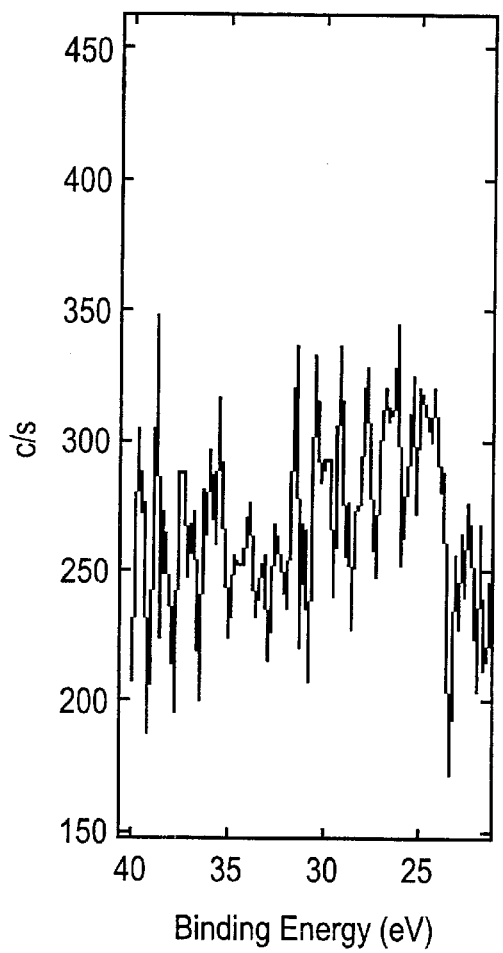
FIG. 1A is an X-ray Photoelectron Spectroscopy (XPS) spectrum of a sample before annealing.

The invention improves upon conventional processes for depositing a copper film on a substrate surface by chemical vapor deposition of a copper precursor. In preferred embodiments, the copper precursor and an adhesion-promoting agent are provided in the CVD chamber simultaneously, resulting in a combined reaction occurring at the interface, which promotes adhesion. Alternatively, addition of the adhesion-promoting agent to the CVD chamber can commence prior to addition of the copper precursor to the CVD chamber and preferably continue during at least the initial stages of CVD copper deposition using the precursor. In embodiments wherein the adhesion-promoting agent and the copper precursor are co-deposited, the adhesion-promoting agent is preferably added for only a short period of time at the start of the CVD copper deposition, with the remainder of the copper film being grown under normal deposition conditions. Co-deposition of the adhesion-promoting agent is maintained until a continuous copper film is produced on the substrate. After forming a continuous film of copper on the barrier layer, the flow of the adhesion-promoting agent is stopped and copper deposition is permitted to continue unaided. When a film of the desired thickness is achieved the deposition process is terminated. The film and substrate are then annealed.

In embodiments, the copper precursor and the adhesion-promoting agent are provided in a homogeneous mixture, which can contain additional ingredients (e.g., an inert gas medium).

The adhesion-promoting agent is preferably a molecule that contains one or more halogen species. Preferably, the adhesion-promoting agent is free of fluorine. More preferably, the adhesion-promoting agent comprises a volatile organic halide and is free of fluorine. Particularly preferred examples of adhesion-promoting agents include methyl chloride, methylene chloride, methyl bromide, bromochloro methane, bromoiodo methane, bromotrichloromethane, and methyliodide. A more comprehensive (but still not exhaustive) list of suitable adhesion-promoting agents includes: all methyl chlorides, including $CH_xCl_y$, where x=0,1,2,3 and y=4−x; all methyl bromides, including $CH_xBr_y$, where x=0,1,2,3 and y=4−x; all methyl iodides, including $CH_xI_y$, where x=0,1,2,3 and y=4−x; simple halide acid gases, including HCl, HBr, and HI; more complex organic halides, including all chloro-, bromo-, and iodo-group substitutions of ethanes, propanes, and higher number straight-chain hydrocarbons (particularly dichloroethene, e.g., trans-dichloroethene, which is sold under the trademark Trans-LC® by the Schumacher unit of Air Products and Chemicals, Inc., Carlsbad, Calif.; $C_2H_5I$; $C_2H_5Br$; and $C_2H_5Cl$); cyclic halides; and aromatic halides. In certain embodiments, the adhesion-promoting agent is $Cl_2$, $Br_2$ and/or $I_2$. In certain embodiments, the adhesion-promoting agent and the overall inventive process are free of iodine.

The copper precursor used in the inventive process is preferably a fluorinated organometallic compound, more preferably a compound comprising hexafluoroacetylacetonate, most preferably Cu(hfac)(TMVS). In embodiments, the copper precursor can be blended with the adhesion-promoting agent and then used to deposit a film.

After the CVD copper deposition is completed, the film and substrate undergo a short high-temperature annealing step to stabilize the film. The term "annealing" as used herein means a post-deposition heat-treatment process. The temperature of the annealing step is preferably about 20 to about 400° C., more preferably 150 to 300° C. The duration of the annealing step is preferably about 0.1 to about 100 minutes, more preferably 5 to 30 minutes. The film and substrate are preferably annealed under vacuum, in the presence of an inert gas, in a pure hydrogen atmosphere, or in a hydrogen-containing (i.e., reducing) atmosphere containing a mixture of 1% to 99% hydrogen and 99% to 1% of at least one inert gas, such as argon, helium, xenon, neon, krypton, or nitrogen.

The inventive process provides a copper-containing film, which is more strongly bound to the barrier layer surface, and better matched texturally. This matching is reflected in a XRD pattern for the copper film that more closely resembles the (111) texture obtained by PVD deposition on barrier layers and subsequent electroplating processes.

Thin films may exhibit a range of atomic order from amorphous to highly crystalline. A crystalline thin film may form as one single crystal with a specific crystallographic orientation relative to the substrate, or as an aggregate of crystals, with random or non-random orientations. XRD is capable of distinguishing highly oriented single crystals or polycrystalline films from polycrystalline films with random orientation. It has been shown that a copper film having (111) as the dominant texture or orientation is preferred because of its resistance to electromigration. Furthermore, it is widely accepted that copper deposited via a CVD process tends to form with a preference for a (200) texture on most commonly utilized barriers, such as tantalum, while copper deposited via a sputtering process on the same barrier films tends to orient with a preference for a (111) texture. The invention described herein not only improves the adhesion of copper but promotes the growth of copper films with a preference for a (111) texture.

The interfacial film (or primer coat) is a continuous film, preferably having a thickness of at least 5 angstroms, more preferably 5 to 600 angstroms. In embodiments, the interfacial film comprises an alloy of copper and the metal(s) on which the diffusion barrier layer is based (e.g., an alloy of copper and tantalum).

The process of the invention is suitable for coating a variety of substrates. Preferably, the substrate surface to be coated (i.e., the diffusion barrier layer) comprises at least one member selected from the group consisting of tantalum, tantalum nitride, titanium, titanium nitride, tungsten and tungsten nitride. Tantalum and tantalum nitride are most preferred.

Processes of the invention are preferably conducted at ambient pressure or less, more preferably at a pressure of about 10 torr to $10^{-10}$ torr. Processes of the invention can be conducted at temperatures below room temperature and at temperatures typically achieved during deposition of barrier layers. Preferably, the processes are conducted at temperatures from 50–400° C., more preferably from 150–250° C. for $Cu^I$ precursors and from 150–350° C. for $Cu^{II}$ precursors when these precursors are used for bulk film deposition after the interfacial layer is formed.

The invention will be illustrated in more detail with reference to the following Examples, but it should be understood that the present invention is not deemed to be limited thereto.

EXAMPLES

The following procedure was used throughout the examples.

Copper was deposited on tantalum-coated wafers via chemical vapor deposition (CVD) in the manner described below. Since the tantalum was exposed to air, and thus had a native oxide, the oxide and any adventitious carbon was removed by light ion sputtering with argon ions before the CVD process. This was performed in an ultra-high vacuum (UHV) chamber (base pressure was $10^{-10}$ Torr). The samples were analyzed via XPS in the UHV chamber to determine the extent of cleaning. Cleaning was complete when carbon and oxygen were not detected and the Ta(4f) region only revealed tantalum metal. In typical integrated cluster tools, this sputter-cleaning step would not be necessary, as the tantalum would not be exposed to air before the deposition step.

Incidentally, the inventors have analyzed sputtered samples before and after the sputtering process via atomic force microscopy and have not found a change in the surface roughness. These sputter-cleaned samples have surfaces similar to PVD, IMP, or sputter deposited barrier layer surfaces. Since the surface roughness does not change, the sputtering does not have a direct effect on the adhesion of the CVD copper.

After sputtering, the sample was transferred in vacuo to the CVD reactor. The sample was typically heated to the deposition temperature in an Ar ambient.

In the CVD reactor, the typical deposition conditions were: 190° C. sample surface temperature, 1.5 Torr (0.03 Torr CVD chamber base pressure), and 40 sccm helium flowing through a bubbler of Cu(hfac)(tmvs) held at 40° C. All delivery lines and the walls of the CVD reactor were maintained at 60° C. Gas and vapor flow were first initiated into a bypass to stabilize flow before introducing these into the CVD reactor.

A conventional tape pull test (ASTM Standard D3359–95a, "Standard Test Method for Measuring Adhesion by Tape Test") was used to evaluate the adhesion of the films grown in the examples. The tape used in the examples was Permacel #99 tape.

Comparative Example

CVD copper films were deposited in accordance with the foregoing procedure. The maximum CVD copper film thickness produced in the above manner that adhered to the sputter-cleaned tantalum surface was approximately 1800 Å. Films having greater thicknesses delaminated. Films grown in the above manner had a mixed texture of (111) and (200) as determined by X-ray Diffraction (XRD) analysis (see Table 1, below).

Example 1

Sample Deposition with Methylene Chloride

The tantalum surface was sputter cleaned and the sample transferred in vacuo to the CVD reactor, as in the previous examples. The sample was heated to 190° C. in an Ar ambient. An initial interfacial layer was formed during a two-minute deposition in a 5 methylene chloride and Cu(hfac)(tmvs) ambient. After the second minute of deposition, the methylene chloride flow was terminated and a bulk copper film was grown to a thickness of ~7700 Å. At the completion of the deposition process, the flow of the copper-containing precursor was stopped and the film was annealed at 350° C. in an argon atmosphere for 50 minutes. This film had 100% adhesion. Films grown in this manner had a predominance of (111) texture, with a small amount of (200) and (220) texture (see Table 1 below).

TABLE 1

| Example | Relative (111) Intensity | Relative (200) Intensity | Relative (220) Intensity |
|---|---|---|---|
| Comparative Example 1 | 100 | 46.8 | 26.6 |
| With MeCl | 100 | 26.7 ± 0.1 | 11.4 ± 0.5 |

Using this procedure, films up to three microns in thickness were grown and found to possess good adhesion.

Example 2

Interfacial Alterations from Co-Deposition of Methylene Chloride

To better understand the interfacial chemistry responsible for the improved adhesion, three samples were prepared and examined by high-resolution XPS surface analysis. The conditions employed for Sample A consisted of a two-minute deposition with only Cu(hfac)(TMVS) (under the deposition conditions utilized, two minutes enabled formation of a continuous surface film of copper). Sample B was prepared by co-depositing methylene chloride and Cu(hfac)(TMVS) for two minutes, followed by a 42-minute anneal in Ar. Sample C was identical to Sample B, without the annealing step. These samples were generated to examine the interfacial surface present immediately before bulk copper film growth. All samples were exposed to ambient during transfer to the XPS system, so after initial analysis a mild sputter was performed (to remove surface oxide and contaminants) and the analysis was repeated. The results are summarized in Table 2, below.

TABLE 2

| | | Relative Atomic Percent | | | | | | |
|---|---|---|---|---|---|---|---|---|
| Sample I.D. | Condition | F | Cu | Cl | C | O | N | Si |
| Sample A (Comparative Ex.) | As Received | 13.0 | 34.2 | 0.5 | 22.1 | 30.2 | ND | ND |
| | After Mild Sputter | ND | 92.8 | ND | 4.8 | 2.4 | ND | ND |
| Sample B | As Received | ND | 38.4 | 0.9 | 49.9 | 10.8 | ND | ND |
| | After Mild Sputter | ND | 88.7 | ND | 8.9 | 2.4 | ND | ND |
| Sample C (Comparative Ex.) | As Received | 1.8 | 40.5 | 2.8 | 22.3 | 23.8 | 8.8 | ND |
| | After Mild Sputter | ND | 94.2 | ND | 5.8 | ND | ND | ND |

ND = None Detected - The element may be present, but it may be at levels below which it can be detected by XPS.
Note: The atomic percents are calculated omitting hydrogen (not detectable by XPS) and are normalized to 100%.

This analysis shows that the co-deposition of Cu(hfac)(TMVS) with methylene chloride virtually eliminates fluorine-containing species, i.e., $C_xF_y$, present at the interfacial surface. The presence of fluorine at the copper-tantalum interface is believed to greatly reduce film adhesion.

Example 3

Interfacial Alterations from Annealing Step

A sample was prepared as outlined above with a two-minute co-deposition of Cu(hfac)(TMVS) and methylene chloride. After this interfacial layer was deposited it was transferred in-vacuo to an XPS system and analyzed for surface chemical composition. The sample was then reintroduced to the CVD chamber and annealed for 30 minutes at 350° C. The sample was then again transferred in-vacuo to the XPS system and re-analyzed for surface chemical composition. The substrate tantalum 4f emission regions for the two analyses are shown in FIGS. 1A and 1B.

Figure 1B:
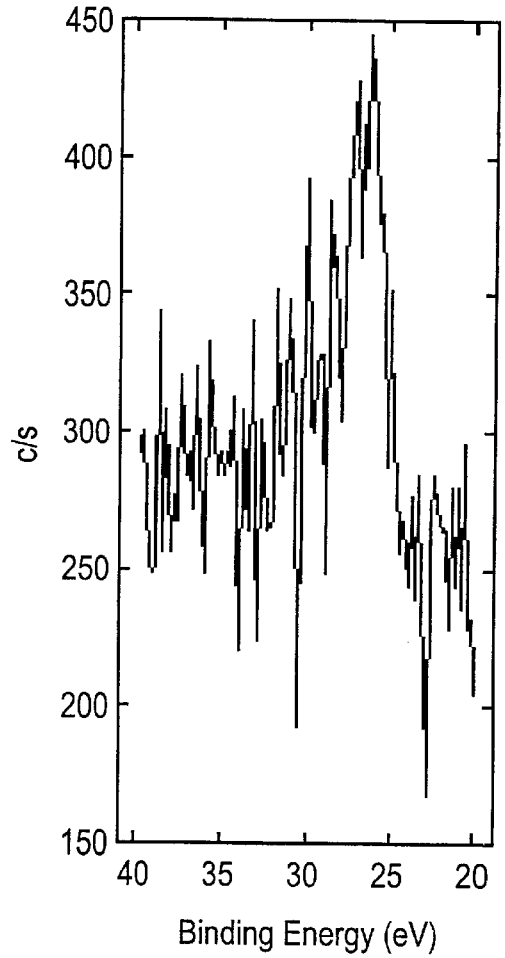
FIG. 1B is an XPS spectrum of a sample after annealing.

As shown in FIG. 1A, before annealing no tantalum is visible at the film surface (in fact, only copper appears elsewhere in the emission spectrum). However, after annealing the sample in argon, some of the substrate barrier layer tantalum begins to show through the deposited copper film, possibly indicating some type of alloying between the two metals at the surface (FIG. 1B). This integration of the copper and the tantalum barrier layer at the interface may result in improved adhesion of the overlying bulk copper film.

While the invention has been described in detail and with reference to specific examples thereof, it will be apparent to one skilled in the art that various changes and modifications can be made therein without departing from the spirit and scope thereof.

What is claimed is:

1. A process for forming a continuous copper film on a surface of a diffusion barrier layer, the process comprising the steps of:
  exposing at least one side of said surface to an adhesion-promoting agent comprising a halogen other than fluorine to saturate at least a portion of the surface with the adhesion-promoting agent;
  forming a copper film on at least a portion of the surface via chemical vapor deposition of a copper precursor; and
  annealing the copper film to the surface of the diffusion barrier layer to remove at least a portion of the adhesion promoting agent wherein the copper film has a texture comprising substantially (111).

2. The process of claim 1, wherein the exposing step is conducted prior to the forming step.

3. The process of claim 1, wherein the exposing step is conducted during at least a portion of the forming step.

4. A process for forming a copper film on a surface of a diffusion barrier layer, the process comprising:
  exposing at least one side of said surface to an adhesion-promoting agent comprising a halogen other than fluorine to saturate at least a portion of the surface with the adhesion-promoting agent;

forming a copper film on at least a portion of the surface via chemical vapor deposition of a copper precursor; and annealing the copper film to the surface of the diffusion barrier layer to remove at least a portion of the adhesion promoting agent wherein the exposing step occurs prior to and/or during at least a portion of the forming step.

5. The process of claim 4, wherein the exposing step is conducted prior to the forming step.

6. The process of claim 5, wherein the exposing step is further conducted during at least a portion of the forming step.

7. The process of claim 4, wherein the exposing step is conducted during at least a portion of the forming step.

8. The process of claim 7, wherein the exposing step and the forming step occur simultaneously.

9. The process of claim 8, wherein the exposing step is terminated after a continuous film is provided on the surface.

10. The process of claim 9, wherein continuous film has a thickness of 5 angstroms to 600 angstroms.

11. The process of claim 9, wherein said continuous film comprises copper and is substantially free of metal fluorides.

12. The process of claim 9, wherein said diffusion barrier layer comprises at least one member selected from the group consisting of tantalum, tantalum nitride, titanium, titanium nitride, tungsten and tungsten nitride, and wherein said continuous film consists essentially of copper.

13. The process of claim 12, wherein said continuous film comprises an alloy of copper and said at least one member.

14. The process of claim 9, wherein said forming step is further conducted after terminating said exposing step.

15. The process of claim 4, wherein said adhesion-promoting agent comprises at least one member selected from the group consisting of an organic halide, HCl, HBr, HI, $Cl_2$, $Br_2$ and $I_2$.

16. The process of claim 4, wherein said adhesion-promoting agent comprises at least one organic halide selected from the group consisting of methyl halides, ethyl halides, propyl halides and dichloroethene.

17. The process of claim 4, wherein said adhesion-promoting agent comprises at least one methyl halide selected from the group consisting of $CH_xZ_{y,z}$ where Z is Cl, Br or I, x is 0,1,2 or 3 and y is 4−x.

18. The process of claim 4, wherein said adhesion-promoting agent comprises an organic halide of a straight-chain hydrocarbon having at least four carbons, a cyclic halide or an aromatic halide.

19. The process of claim 4, wherein said adhesion-promoting agent comprises methylene chloride.

20. The process of claim 4, wherein said process is free of iodine.

21. The process of claim 4, wherein said copper precursor is a fluorinated organometallic compound.

22. The process of claim 4, wherein said copper precursor comprises hexafluoroacetylacetonate.

23. The process of claim 4, wherein said copper precursor is 1,1,1,5,5,5-hexafluoro-2,4-pentanedionato-copper (I) trimethylvinylsilane.

24. The process of claim 4, wherein said copper film is annealed at a temperature of 20 to 400° C., a pressure of the base pressure of the system to 10 Torr, an atmosphere comprising 0 to 100% hydrogen gas and 100 to 0% of at least one inert gas selected from the group consisting of argon, nitrogen, helium, neon, krypton and xenon.

25. The process of claim 4, wherein said copper precursor contains $Cu^I$ and said copper precursor is deposited at a temperature of 150 to 250° C.

26. The process of claim 4, wherein said copper precursor contains $Cu^{II}$ and said copper precursor is deposited at a temperature of 150 to 350° C.

27. The process of claim 4, conducted at a pressure of 10 torr to $10^{-10}$ torr.

28. The process of claim 4, wherein a texture of said copper film is predominantly (111).

29. A substrate comprising a copper-based film produced by the process of claim 28.

30. The process of claim 4, wherein said copper precursor and said adhesion-promoting agent are provided by a mixture comprising said copper precursor and said adhesion-promoting agent.

* * * * *

UNITED STATES PATENT AND TRADEMARK OFFICE
CERTIFICATE OF CORRECTION

PATENT NO.     : 6,509,266 B1
DATED          : January 21, 2003
INVENTOR(S)    : Ralph J. Ciotti et al.

It is certified that error appears in the above-identified patent and that said Letters Patent is hereby corrected as shown below:

Column 9,
Line 37, delete "Hl" and substitute therefor -- HI --
Line 37, delete "l$_2$" and substitute therefor -- I$_2$ --

Column 10,
Line 3, delete "CH$_x$Z$_{y,z}$" and substitute therefore -- CH$_x$Z$_y$ --
Line 4, delete "l," and substitute therefore -- I, --
Line 27, delete "Cu$^b$" and substitute therefore -- Cu$^I$ --
Line 30, delete "Cu$^{lb}$" and substitute therefore -- Cu$^{II}$ --

Signed and Sealed this

Eighteenth Day of March, 2003

JAMES E. ROGAN
*Director of the United States Patent and Trademark Office*